United States Patent [19]

Imahashi et al.

[11] Patent Number: 5,537,004
[45] Date of Patent: Jul. 16, 1996

[54] LOW FREQUENCY ELECTRON CYCLOTRON RESONANCE PLASMA PROCESSOR

[75] Inventors: Issei Imahashi, Yamanashi-ken; Takayuki Fukasawa, Yamanashi, both of Japan

[73] Assignee: Tokyo Electron Limited, Tokyo, Japan

[21] Appl. No.: 235,641

[22] Filed: Apr. 29, 1994

Related U.S. Application Data

[63] Continuation-in-part of Ser. No. 205,798, Mar. 4, 1994.

[30] Foreign Application Priority Data

Mar. 6, 1993 [JP] Japan ................................... 5-71225
May 1, 1993 [JP] Japan ................................... 5-128231

[51] Int. Cl.⁶ ............................................. H01J 7/24
[52] U.S. Cl. .................... 315/111.21; 315/111.71; 315/111.41; 315/85; 118/723 R; 118/620; 118/623
[58] Field of Search .................. 315/111.21, 111.41, 315/111.51, 111.71, 111.81, 111.91, 85; 118/723, 728, 50.1, 620, 623; 204/192 R, 298

[56] References Cited

U.S. PATENT DOCUMENTS 3,875,068  4/1975  Mitzel ........................ 250/531
4,298,419  11/1981 Suzuki et al. ................. 156/345
4,368,092  1/1983  Steinberg et al. ............. 156/345
4,401,054  8/1983  Matsuo et al. ................. 118/723
4,492,620  1/1985  Matsuo et al. ............... 204/192 R
4,776,918  10/1988 Otsubo et al. ................. 156/345
4,810,935  3/1989  Boswell .................... 315/111.41
4,902,099  2/1990  Okamoto et al. .......... 315/111.21 X
4,908,492  3/1990  Okamoto et al. .......... 315/111.21 X
5,134,965  8/1992  Tokuda et al. ................. 118/723
5,370,765  12/1994 Dandl ......................... 156/643

Primary Examiner—Robert Pascal
Assistant Examiner—Haissa Philogene
Attorney, Agent, or Firm—Oblon, Spivak, McClelland, Maier & Neustadt

[57] ABSTRACT

A plasma processor includes a cylindrical processing chamber storing a semiconductor wafer to be processed, a slot antenna, wound around the outside of a peripheral wall of the processing chamber, for feeding an electromagnetic wave of several tens MHz to the chamber, and an electromagnetic coil, provided on the outside of the processing chamber, for generating plasma in a plasma generating section due to electron cyclotron resonance by applying a magnetic field of 30 gausses or less to said processing chamber. The slot antenna has an elongated conductive plate having a length of about ½ of the wavelength of the electromagnetic wave, and an elongate slot formed in the conductive plate.

15 Claims, 1 Drawing Sheet

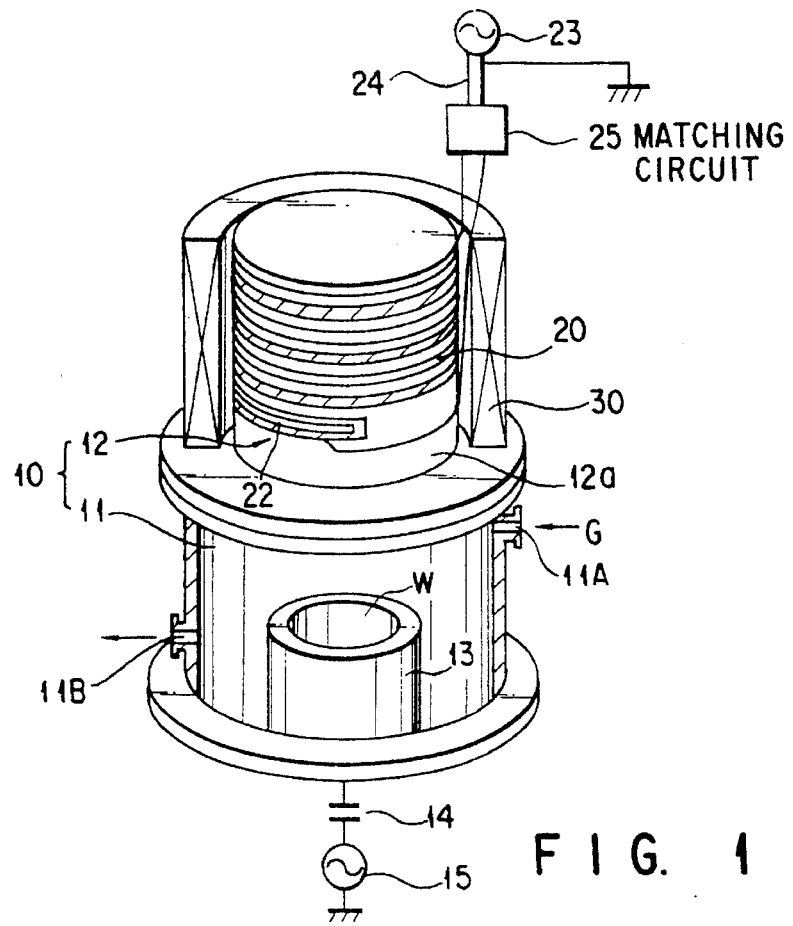
F I G. 1
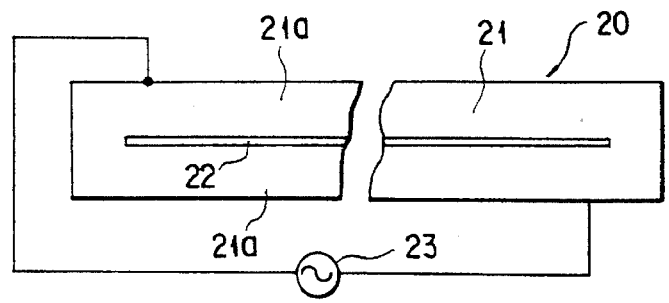
F I G. 2
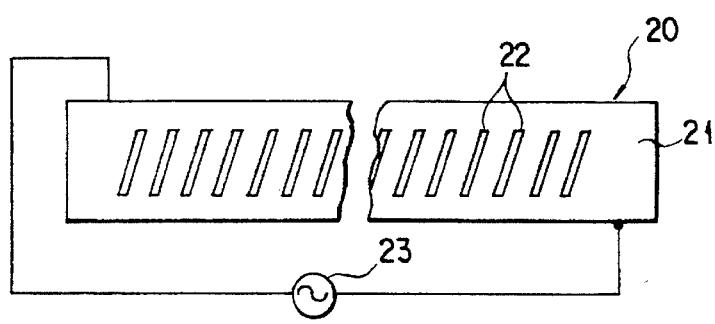
F I G. 3

LOW FREQUENCY ELECTRON CYCLOTRON RESONANCE PLASMA PROCESSOR

CROSS-REFERENCE TO THE RELATED APPLICATION

This application is a continuation-in-part of U.S. patent application Ser. No. 08/205,798 filed on Mar. 4, 1994.

BACKGROUND OF THE INVENTION

1. Field of the Invention

The present invention relates to a plasma processor for generating plasma by electron cyclotron resonance (ECR).

2. Description of the Related Art

The plasma processor is structured to generate plasma by vacuum discharge in a processing chamber in which processing gas exists and to provide a predetermined processing to a processing object by use of plasma. This type of the plasma processor has been widely used in sputtering, ashing, CVD, or etching in a semiconductor manufacturing process.

As a typical plasma processor, there is used a pair of parallel plate electrodes as plasma generating means. This type of plasma processor is used under relatively high gas pressure of e.g., several hundreds nm Torr in view of an electrode structure. Due to this, an active material such as an ion material in plasma collides with the electrode, so that the electrode is sputtered, and impurity materials are generated from the electrode. For this reason, such a plasma processor has a problem with maintaining purity. Also, in such a plasma processor, there is difficulty in satisfying the recent requirement of a fine structure processing of half micron or more. In order to solve this problem, there has conventionally been disclosed an ECR plasma processor for generating plasma by use of electron cyclotron resonance under higher vacuum of several nm Torr.

In the conventional ECR plasma processor, a microwave of 2.45 GHz is normally introduced into a processing chamber, a magnetic field of 875 gausses is also applied to the processing chamber, and process gas is changed to plasma even under high vacuum of several nm Torr as a result of the electron cyclotron resonance. As a result, a rate of ionization can be improved and plasma having a high density can be obtained.

However, in the above conventional ECR plasma processor, since the microwave of 2.45 GHz is used, it is required that a predetermined physical relation be added to induce electron cyclotron resonance in such a microwave. Due to this, the magnetic field of 875 gausses must be applied to the chamber. However, in a case that etching process is provided to a semiconductor wafer in accordance with a fine pattern having a predetermined shape in a state that such a strong magnetic field is applied, plasma is easily unevenly distributed due to the strong magnetic field. Then, a charge-up phenomenon partially occurs in the semiconductor wafer by the uneven distribution of plasma, and deformation is generated in the etching shape by the charge-up phenomenon. As a result, the fine processing with high accuracy cannot be performed. Also, there is difficulty in forming the magnetic field having a uniform intensity for performing the fine processing with high accuracy.

SUMMARY OF THE INVENTION

An object of the present invention is to provide a plasma processor wherein electron cyclotron resonance is induced under a lower magnetic field to generate a plasma of process gas, so that influence of the magnetic field is relaxed, and a plasma processing with high accuracy can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

FIG. 1 is a view schematically showing an embodiment of the plasma processor of the present invention;

FIG. 2 is a developed plane view showing a slot antenna used in the plasma processor of FIG. 1; and FIG. 3 is a developed plane view showing a modification of the slot antenna.

DETAILED DESCRIPTION OF THE PREFERRED EMBODIMENT

A plasma processor generator of an embodiment of the present invention will be explained with reference to the figures.

The plasma processor of this embodiment comprises a processing chamber 10 formed of a storage chamber 11 for storing a semiconductor wafer W as a processing object, and a plasma generating chamber 12, which is continuously provided upwardly at an opening portion circularly formed in the upper surface of the storage chamber 11. A slot antenna 20 is wound around an outer peripheral surface of the plasma generating chamber 12 through a sheet 12a, which is preferably made of ferrite-based material. The sheet 12a is used to prevent the generation of electrostatic coupling by charging an outer peripheral wall of the plasma generating chamber 12 by the antenna 20. An electromagnetic coil 30, serving as magnetic field applying means for applying a magnetic field into the plasma generating chamber 12, is provided to enclose the plasma generating chamber 12 at the outside of the antenna.

In the above plasma processor, an electromagnetic wave of 1 MHz to 200 MHz, for example, several tens MHz is introduced to the plasma generating chamber 12 by the antenna 20, and a low magnetic field of 30 gausses or less is also applied thereto by the electromagnetic coil 30. Thereby, plasma is generated in the plasma generating chamber 12 by electron cyclotron resonance. The intensity of the magnetic field is preferably 20 gausses or less, and more preferably 15 gauss or less. If the intensity of the magnetic field exceeds 30 gauss, the magnetic filed is unevenly distributed in the plasma generating chamber 12. Due to this, unevenness of density of plasma is considerable, charge-up is easily generated in the semiconductor wafer W, and there occurs difficulty in performing an etching process with high accuracy. On the other hand, if the intensity of the magnetic field is too low, plasma cannot be generated. Therefore, the intensity of the magnetic field is preferably 5 gausses or more. A frequency of the electromagnetic wave is set from a physical condition of generating electron cyclotron resonance, eB/m=2 πf based on the intensity of the magnetic field.

The above plasma processor will be explained in detail as follows.

The storage chamber 11 of the generating chamber 10 is formed of a cylindrical member, which is made of a conductive material such as stainless, and has a closed bottom surface. A gas supply port 11A for supplying process gas to an internal portion is formed on an upper portion of the peripheral side wall. A gas discharging port 11B for discharging processed gas is formed on a lower portion of the side surface. A susceptor 13 on which a semiconductor wafer W is mounted is provided in the storage chamber 13. A high frequency power source 15 is connected to the susceptor 13 through a capacitor 14. A high frequency voltage is applied to the susceptor 13 from the high frequency power source 15, so that a self-bias potential to a plasma potential is maintained. On the other hand, the plasma generating chamber 12 is formed of a cylindrical member, which is made of an insulation material such as quartz through which the electromagnetic wave is passed, and has a closed upper end. In this embodiment, an outer diameter of the plasma generating chamber 12 is set to, for example, 300 mm. The plasma generating chamber 12 and the storage chamber 10 are airtightly sealed by connecting the respective flanges, which are formed to face each other at their opening ends.

The slot antenna 20 is spirally wound around the outer peripheral surface of the plasma generating chamber 12 from a portion close to the lower end to a portion close to the upper end at a pitch of 8 mm. The antenna 20 is belt-like shaped as shown in FIG. 2. The antenna 20 is formed of a conductive plate 21 such as a copper plate having a width of 4 cm+ several mm and a length of 3.35 m. A slot 22 is formed at a center of the conductive plate to extend to portions close to both ends along a longitudinal direction. In this way, the slot antenna is formed. In the preferable embodiment, the slot 22 has a width of several mm, and preferably 1 to 5 mm. Therefore, a pair of conductive plate pieces 21a sandwiching the slot have a width of about 2 cm. The length of the antenna 20 is set to about ½ of the wavelength of the radiating electromagnetic wave. A high frequency power source 23 is connected between both conductive plate pieces 21a of the antenna 20 through a coaxial cable 24. A frequency, which is suitable to the length of the antenna 20, that is, electromagnetic wave of 40 MHz is fed to the antenna 20 from the high frequency power source 23. In the vicinity of the antenna 20, a matching circuit 25 is formed. Then, impedance matching is performed by the matching circuit 25, so that the coaxial cable 24 is connected to the antenna 20, and the electromagnetic wave of 40 MHz is radiated to the whole interior of the plasma generating chamber 11 from the slot 22 of the antenna 20.

In other words, the antenna 20 is structured such that the high frequency power of 40 MHz is supplied from the high frequency power source 23 and the electromagnetic wave of 40 MHz is radiated to the plasma processing chamber 12 from the slot 22. Also, in order to generate plasma due to electron cyclotron resonance using the electromagnetic wave of 40 MHz, the intensity of the magnetic field to be applied by the electromagnetic coil 30 is B=14 gausses from the physical condition, ω=eB/m=2 πf. Therefore, according to the above-explained plasma processor, the high frequency power of 40 MHz is fed to the antenna 20 from the high frequency power source 23, so that the electromagnetic wave of 40 MHz is introduced to the plasma generating chamber 12 from the slot 22. Also, by the electromagnetic wave and the low magnetic field of 14 gausses, plasma with high density (plasma of order of $10^{11}$ cm$^{-3}$) can be generated in the plasma generating chamber 12 due to electron cyclotron resonance.

The following will explain an operation.

The interior of the processing chamber 10 is vacuumed by the susceptor 13 to set a predetermined degree of vacuum in a state that the semiconductor wafer W is held. Then, process gas is supplied from the gas supply portion 11A to the processing chamber 10, which is maintained to the predetermined degree of vacuum, so that the gas pressure is maintained to a predetermined degree of vacuum, for example, high vacuum. Thereafter, if the high frequency voltage is applied to the susceptor 13 through the capacitor 14 and the high frequency power of 40 MHz is fed thereto from the high frequency power source 23, the electromagnetic wave is transmitted to the matching circuit 25 through the coaxial cable 24. Then, impedance matching is performed by the matching circuit 25, and the electromagnetic wave of 40 MHz is radiated to the plasma generating chamber 12 from the slot 22 of the antenna 20. At this time, the magnetic field of 14 gauss is applied to the plasma generating chamber 12 by the electromagnetic coil 30, plasma with high density (plasma of order of $10^{11}$ cm$^{-3}$ base) can be generated from process gas due to electron cyclotron resonance by the electromagnetic wave sent from the antenna 20 and the magnetic field.

On the other hand, since the high frequency voltage is applied to the susceptor 13 through the capacitor 14, electrons are drawn on a priority basis from plasma formed above the susceptor and are negatively self-biased, and an ion sheath is formed between plasma and susceptor. Due to this, a large potential difference is generated between the susceptor 13, that is, the semiconductor wafer W and plasma and the ions in plasma collide with the semiconductor wafer W, and a predetermined etching is performed.

According to the above-explained embodiment, the slot antenna 20 is wound around the plasma generating chamber 12, and the electromagnetic wave of 40 MHz is radiated to the interior of the plasma generating chamber 12. Also, the magnetic field of 14 gausses is applied thereto by the electromagnetic coil 30. Thereby, plasma is generated in the plasma generating chamber 12 from process gas G due to electron cyclotron resonance. Therefore, the semiconductor wafer W can be etched even in the low magnetic field of 14 gausses. Because of the low magnetic field, even if the magnetic filed is unevenly distributed in the plasma generating chamber 12, unevenness of density of plasma can be relaxed. Moreover, charge-up in the semiconductor wafer W can be controlled, and the semiconductor wafer W can be etched with high accuracy.

The above embodiment explained the case in which the electromagnetic wave of 40 MHz is introduced to the plasma generating chamber 12 from the slot antenna 20, the low magnetic field of 14 gausses is applied to the plasma generating chamber 12 by the electromagnetic coil 30, plasma is generated from process gas G due to electron cyclotron resonance, and the semiconductor wafer W is etched. However, according to the plasma processor of the present invention, if the electromagnetic wave of several tens of MHz is introduced from the slot antenna, and the low magnetic field of 30 gausses or less is applied thereto by magnetic field applying means, thereby generating plasma, any plasma processor may be used, the length of the antenna can be suitably changed in accordance with a predetermined frequency (wavelength) of the electromagnetic wave to be introduced to the plasma generating section. Also, the plasma processor of the present invention is not limited to the etching processing. The plasma processor of the present invention can be applied to sputtering, ashing, and CVD.

The slot antenna is not limited to the shape as shown in FIG. 2. For example, a slot antenna in which a plurality of elongated slots 22 are formed may be used. Also, a slot antenna in which a large number of short slots 22 are formed may be used as shown in FIG. 3.

Moreover, the slot antenna may be provided along the upper surface of the plasma generating chamber 12. In this case, the elongated slot antenna may be spirally wound. Also, the slot may be spirally formed in a disk-shaped conductive plate corresponding to the shape of the upper surface, or a large number of short slots may be formed to a predetermined pattern.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processor comprising:

a processing chamber having a storage section storing an object to be processed and a plasma generating section having a peripheral wall and formed continuous to the storage section;

slot antenna means wound around the peripheral wall of the plasma generating section, for radiating an electromagnetic wave into the plasma generating section of the processing chamber;

magnetic field generating mans for generating plasma in cooperation with said electromagnetic waves by applying a magnetic field to said plasma generating section; and wherein said slot antenna means comprises an elongated belt-like antenna that is spirally wound around the outside of the peripheral wall.

2. A plasma processor according to claim 1, wherein said slot antenna means and magnetic field generating means apply the electromagnetic wave having a frequency satisfying electron cyclotron resonance condition and the magnetic field having intensity satisfying electron cyclotron resonance condition, respectively.

3. A plasma processor according to claim 2, wherein said electromagnetic wave has a frequency of 1 MHz to 200 MHz, and said magnetic field has intensity of 5 to 30 gausses.

4. A plasma processor according to claim 1, wherein said electromagnetic wave has a frequency of 1 MHz to 200 MHz.

5. A plasma processor according to claim 1, wherein said magnetic field has intensity of 5 to 30 gausses.

6. A plasma processor according to claim 1, which further includes a sheet made of ferrite-based material between the slot antenna means and the processing chamber.

7. A plasma processor comprising:

a cylindrical processing chamber having a peripheral wall and for containing an object to be processed;

a slot antenna, wound around the outside of the peripheral wall of the cylindrical processing chamber, for feeding an electromagnetic wave of several tens of MHz to the chamber; and magnetic field applying means, provided on the outside of the processing chamber, for generating plasma in a plasma generating section due to electron cyclotron resonance by applying a magnetic field of 30 gausses or less to said processing chamber.

8. A plasma processor comprising:

a cylindrical processing chamber having a peripheral wall and for containing an object to be processed;

a slot antenna, wound around the outside of the peripheral wall of the cylindrical processing chamber, for feeding an electromagnetic wave of several tens of MHz to the chamber;

magnetic field applying means, provided on the outside of the processing chamber, for generating plasma in a plasma generating section due to electron cyclotron resonance by applying a magnetic field of 30 gausses or less to said processing chamber; and wherein said slot antenna has an elongated conductive plate having a length of about ½ of the wavelength of said electromagnetic wave, and at least one slot formed in said conductive plate.

9. A plasma processor according to claim 8, wherein said slot is an elongate slot extended to portions close to both ends of the conductive plate along the conductive plate.

10. A plasma processor according to claim 9, wherein said slot has a width of 1 to 5 mm.

11. A plasma processor comprising:

a cylindrical processing chamber having a peripheral wall and for containing an object to be processed;

a slot antenna, wound around the outside of the peripheral wall of the cylindrical processing chamber, for feeding an electromagnetic wave of several tens of MHz to the chamber;

magnetic field applying means, provided on the outside of the processing chamber, for generating plasma in a plasma generating section due to electron cyclotron resonance by applying a magnetic field of 30 gausses or less to said processing chamber; and wherein said slot antenna has an elongated conductive plate having a length of about ½ of the wavelength of said electromagnetic wave, and an elongated slot formed at a center of the conductive plate, extending to portions close to both ends of the conductive plate along the conductive plate, and having a width of about 1 to 5 mm, and said conductive plate has a width having the width of the slot+4 cm.

12. A plasma processor comprising:

a cylindrical processing chamber having a peripheral wall and for containing an object to be processed;

a slot antenna, wound around the outside of the peripheral wall of the cylindrical processing chamber, for feeding an electromagnetic wave of several tens of MHz to the chamber;

magnetic field applying means, provided on the outside of the processing chamber, for generating plasma in a plasma generating section due to electron cyclotron resonance by applying a magnetic field of 30 gausses or less to said processing chamber; and wherein said slot antenna has an elongated conductive plate having a length of about ½ of the wavelength of said electromagnetic wave, and a plurality of slots formed with a predetermined distance along a longitudinal direction of the conductive plate.

13. A plasma processor comprising:

a processing chamber having a peripheral wall and a plasma generating section and for containing an object to be processed;

an elongated slot antenna wound around the outside of the peripheral wall of the processing chamber, for feeding an electromagnetic wave to the chamber, the slot antenna having an elongated conductive plate having first and second ends and having surfaces forming an elongated slot, said elongated slot extends to portions of the conductive plate close to the first and second ends of the elongated conductive plate; and magnetic field applying means provided on the outside of the processing chamber in the plasma generation section for generating electron cyclotron resonance in the plasma generation section by applying a magnetic field to the processing chamber.

14. A plasma processor according to claim 13, wherein the slot has a width of 1 to 5 mm.

15. A plasma processor comprising:

a processing chamber having a peripheral wall, a plasma generation section and for containing an object to be processed, and a longitudinal axis;

an elongated slot antenna wound around the outside of the peripheral wall of the processing chamber, for feeding an electromagnetic wave to the chamber, the elongated slot antenna having an elongated conductive plate with surfaces forming a plurality of slots, each of the plurality of slots having a length along the direction of the longitudinal axis;

magnetic field applying means provided on the outside of the processing chamber in the plasma generation section for generating electron cyclotron resonance by applying a magnetic field to the processing chamber.

* * * * *